United States Patent [19]

Kumar et al.

[11] Patent Number: 4,728,834
[45] Date of Patent: Mar. 1, 1988

[54] COMPACT DIGITAL RESOLVER/ENCODER ASSEMBLY WITH FLEXIBLE CIRCUIT BOARD

[75] Inventors: Shalabh Kumar, Kildeer; Keith R. Johnson, Orland Park, both of Ill.

[73] Assignee: Autotech Corporation, Carol Stream, Ill.

[21] Appl. No.: 738,411

[22] Filed: May 28, 1985

[51] Int. Cl.⁴ .................... H02K 11/00; H02K 23/66
[52] U.S. Cl. .................... 310/68 R; 310/43; 310/89; 310/DIG. 6; 361/395
[58] Field of Search ............ 29/596; 310/40 MM, 43, 310/45, 68 R, 68 B, 68 D, 71, 87, 89, DIG. 6, 88; 340/347 P; 361/395, 402

[56] References Cited

U.S. PATENT DOCUMENTS

| | | | |
|---|---|---|---|
| 3,707,638 | 12/1972 | Nailen | 310/152 |
| 3,761,750 | 9/1973 | Green | 310/87 |
| 3,963,919 | 6/1976 | Sells | 340/347 P |
| 4,259,603 | 3/1981 | Uchiyama et al. | 310/68 B |
| 4,456,844 | 6/1984 | Yamamoto et al. | 310/71 |
| 4,509,002 | 4/1985 | Hollis, Jr. | 318/640 |
| 4,518,886 | 5/1985 | Kaneyuki | 310/71 |
| 4,603,238 | 7/1986 | Griswold et al. | 340/347 P |

FOREIGN PATENT DOCUMENTS

| | | | |
|---|---|---|---|
| 1653752 | 7/1971 | Fed. Rep. of Germany | 310/87 |
| 126444 | 4/1980 | Japan | 310/43 |
| 111656 | 8/1980 | Japan | 310/40 MM |

Primary Examiner—Patrick R. Salce
Assistant Examiner—D. L. Rebsch
Attorney, Agent, or Firm—Thomas R. Vigil

[57] ABSTRACT

The compact digital resolver/encoder assembly comprises a resolver and a flexible printed circuit board having a number of electronic components for decoding the resolver mounted on the flexible printed circuit board. A generally cylindrical container is provided having a cylindrical wall, a closed end and an open end. The circuit board is folded into a generally cylindrical shape and received in the container separate from the resolver. The circuit board is insulated from the container by an electrical insulating potting compound situated in the container and surrounding the circuit board. The resolver is received in the container and is spaced a predetermined distance from the encapsulated circuit board. Preferably a voltage regulator is mounted to an inside wall of the container and electrically coupled to the circuit board. Also, preferably, wire conductors between the resolver and the circuit board are longer than necessary to allow the resolver to be positioned outside the container when the potting compound is inserted in the container.

24 Claims, 6 Drawing Figures

COMPACT DIGITAL RESOLVER/ENCODER ASSEMBLY WITH FLEXIBLE CIRCUIT BOARD

BACKGROUND OF THE INVENTION

1. Field of the Invention

The present invention relates to a compact resolver/encoder assembly.

2. Description of the Prior Art

Heretofore resolver/encoder assemblies have been proposed which include a stator housing with a rotor journalled therein and an external electronic circuit board having electronic components electrically coupled to the stator and rotor windings of the resolver/encoder.

Such assemblies were bulky, required connections between the stator housing and the circuit board, and were subject to harmful environmental conditions, e.g., moisture.

As will be described in greater detail hereinafter, the resolver/encoder assembly of the present invention differs from the previously proposed resolver/encoder assemblies by providing a compact assembly having all the major components thereof mounted in a resolver/encoder housing through use of a flexible printed circuit board which can be rolled or coiled into a generally cylindrical configuration and mounted in the resolver/encoder housing.

SUMMARY OF THE INVENTION

According to the invention there is provided a compact digital resolver/encoder assembly comprising: a resolver; a flexible printed circuit board; a number of electronic components for decoding the resolver being mounted on said flexible printed circuit board; a generally cylindrical container having a cylindrical wall, a closed end and an open end; said circuit board being folded into a generally cylindrical shape and being received in said container separate from said resolver; means for insulating said circuit board from said container including an electrical insulating potting compound situated in said container and surrounding said circuit board; and said resolver being received in said container, being spaced a predetermined distance apart from the encapsulated circuit board.

In some embodiments the electronic circuitry can be formed in at least one integrated circuit chip mounted on a flexible circuit board.

Preferably, a voltage regulator is fixed to the container inside the container so that the container can serve as a heat sink for said voltage regulator. The voltage regulator is electrically coupled to the circuit board.

The folded circuit board defines a central space and the resolver can be mounted in the container within the central space. An electrical connection is provided between the printed circuit board and the resolver and includes insulated wire conductors which can be longer than necessary for the connection but long enough for allowing the resolver to be positioned outwardly of the container when the circuit board is inserted in the container, after which the wire conductors are folded into loops and inserted into the central space with the resolver.

DESCRIPTION OF THE PREFERRED EMBODIMENT

Figure 1:
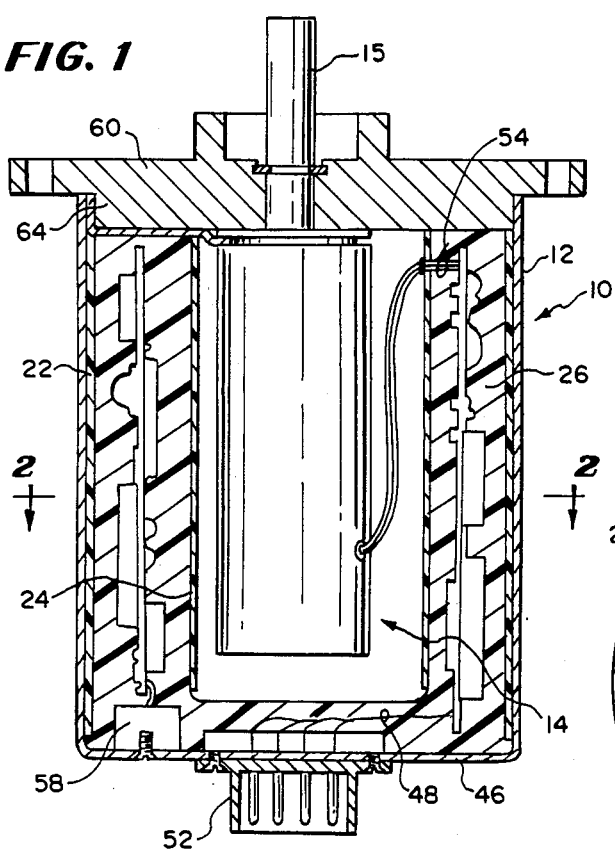
FIG. 1 is an axial sectional view of the resolver/encoder assembly of the present invention.

Referring now to the drawings in greater detail there is illustrated in FIG. 1 a resolver/encoder assembly 10. The resolver/encoder assembly 10 includes a cylindrical housing or container 12 containing a resolver 14 having a stator and rotor assembly therein (not shown) connected to a shaft 15. Such resolvers are well known in the art as resolvers, resolver transducers or transducers and transduce each shaft angle position to a unique analog signal.

The resolver/encoder assembly 10 also includes a control circuit 16 (FIG. 3) which, in accordance with the teachings of the present invention, is mounted on a flexible printed circuit board 18 with circuitry on both sides.

Figure 4:
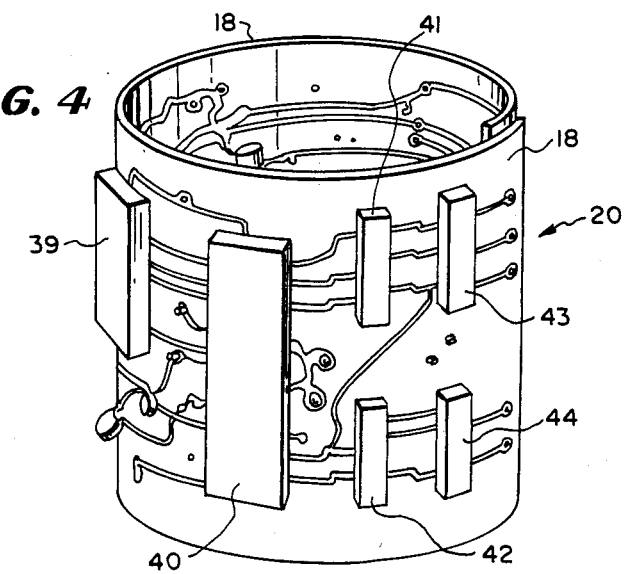
FIG. 4 is a perspective view of the flexible printed circuit board in its folded position.

Further in accordance with the teachings of the present invention and as will be described in greater detail hereinafter, the flexible printed circuit board 18 is folded, rolled or coiled into a generally cylindrical envelope or shape 20 (FIGS. 2, 4 and 5) and inserted in the cylindrical housing 12 and fixed therein between an outer or coiled sheet of insulation or insulator 22 and an insulator or form 24 defined by an inner coiled sheet of insulation 24, by a potting compound 26 to provide a compact resolver/encoder assembly 10.

Figure 3:
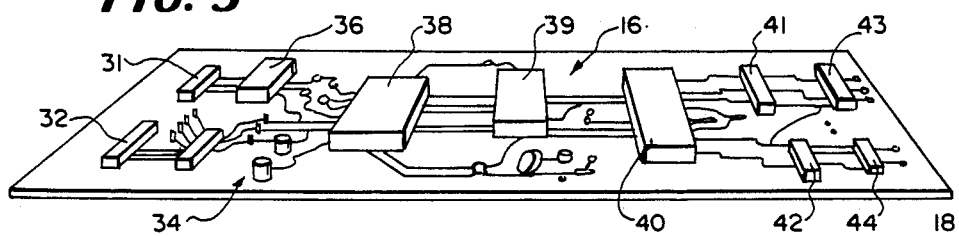
FIG. 3 is a perspective view of a flexible printed circuit board of the assembly in its unfolded position.

As best shown in FIG. 3, the printed circuit board 18 has affixed to it various electronic components which form the electrical circuit 16. These components are chosen to have values which function and operate to, and are arranged to minimize heat generation within the circuit 16. Typically such circuit 16 includes input buffers 31 and 32 for selecting different input signals, an oscillator circuit 34 for generating clock signals, a DC to DC converter 36, a hybrid resolver tracking converter 38, a high address decoding PROM 39, a low address decoding PROM 40, latching circuits 41 and 42, and buffer/driver circuits 43 and 44.

In accordance with the teachings of the present invention, the flexible printed circuit board 18 (FIG. 3) is folded to the generally cylindrical shape 20 (FIG. 4) to facilitate insertion thereof into the cylindrical housing 12 above a bottom wall 46 thereof and between the insulators or forms 22 and 24. Then a potting compound 26 is inserted in the space or area between the forms 22 and 24 above the housing bottom wall 46.

As shown in FIG. 1, the printed circuit board 18 has electrical wire conductors 48 connected thereto and to a multi-terminal connector 52 which is fixed to the bottom wall 46 of the cylindrical housing or container 12.

The flexible printed circuit board 18 also has electrical wire conductors 54 connected thereto and to the stator and rotor assembly 14 as shown in FIG. 1.

It is also to be understood that the electrical wire conductors 54 are sufficiently long to allow the resolver 14 to be positioned outwardly of the cylindrical container 12 when the potting compound 26 is being inserted into the container 12 for surrounding and insulating the printed circuit board 18.

Figure 2:
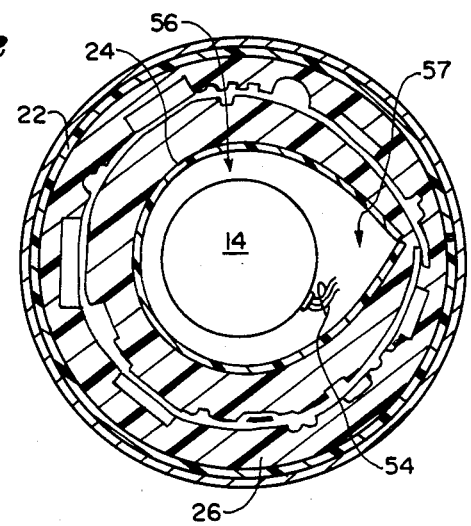
FIG. 2 is a radial sectional view of the resolver/encoder assembly shown in FIG. 1 and is taken along line 2—2 of FIG. 1.

As shown in FIGS. 1 and 2, the potting compound 26 has the printed circuit board 18 embedded therein to electrically insulate the electrical components 31–44 of the circuit 16 and renders then impervious to moisture. Typically the potting compound 26 is R.T.V., an epoxy or any other suitable type of potting compound.

The form 24 which forms a space with a tear drop cross section is used to provide a cylindrical space 56 which allows placement of the resolver 14 inside the cylindrical container 12 and an eccentric space 57 for the wire conductors 54. The form 24 is made of any flexible material which will provide for such a tear drop cross section, such as flexible paper board.

Also, as shown in FIG. 1, the circuit 16 includes a voltage regulator 58 which is fixed to the bottom wall 46 of the cylindrical container 12 which serves as a heat sink for the heat generated by the voltage regulator 58. The flexible printed circuit board 18 in coiled form 20 is positioned above the voltage regulator 58 and separated from the heat generating voltage regulator 58 before the potting step and afterwards by the potting compound 26.

The insulator or form 22 adjacent to the inner surface of the cylindrical container 12 is inserted before the potting step to ensure that there is no short circuit between the coiled 20 flexible printed circuit board 18 and the cylindrical container 12.

The resolver 14 includes an end flange 60 from which the rotor shaft 15 extends. The flange 60 has an annular shoulder 64 on the underside thereof which can be press fit into the upper open end of the container 12.

Figure 5:
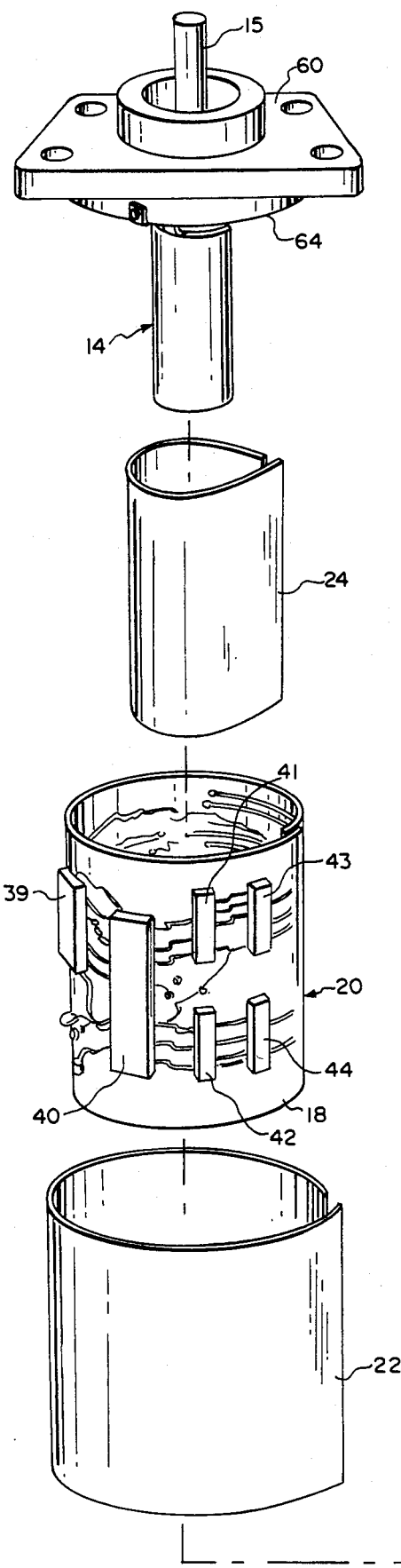
FIG. 5 is an exploded perspective view of the resolver/encoder assembly of the present invention.
Figure 5:
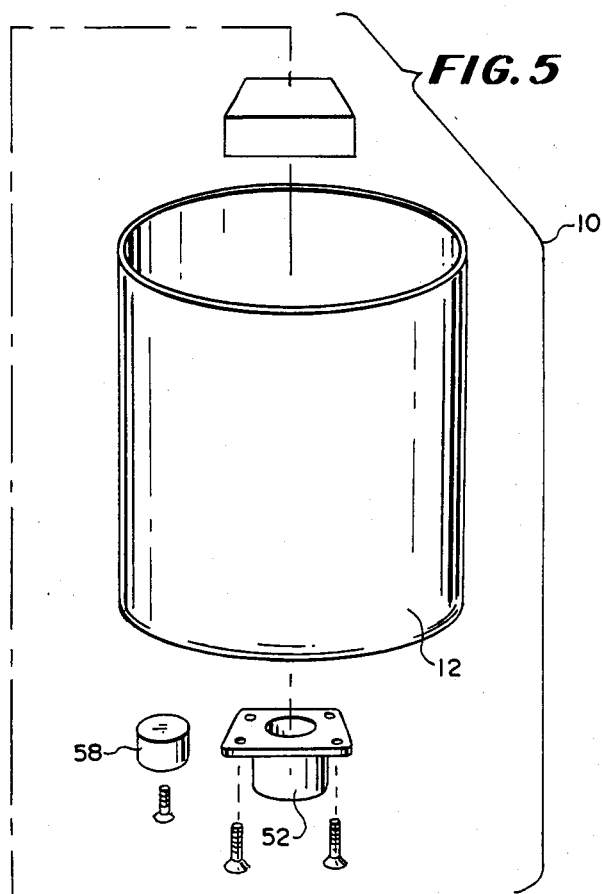
Figure 6:
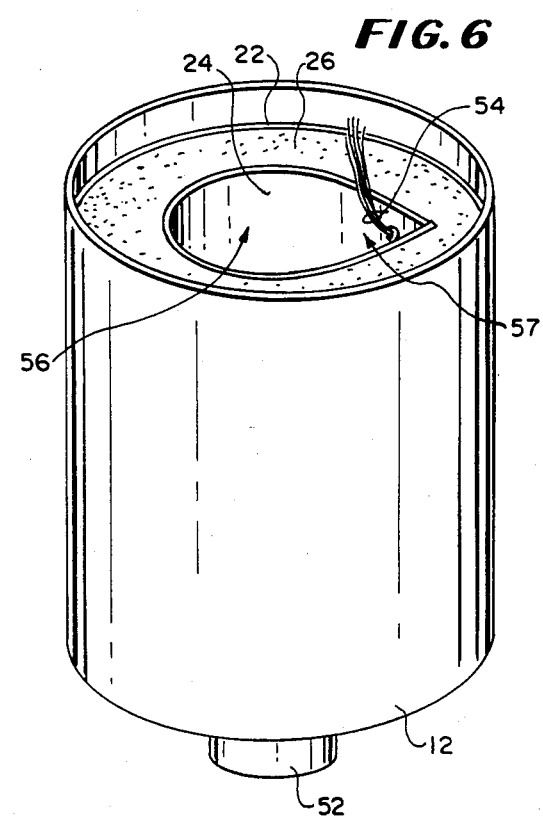
FIG. 6 is a perspective view of the assembled parts of the stator of the resolver/encoder assembly of the present invention.

The method for assembling the resolver/encoder assembly 10 is shown in FIG. 5 and described as follows:

First the multi-terminal connector 52 is secured to the bottom wall 46 of the cylindrical container 12 by means of suitable fasteners, e.g., screws.

Then the insulator or form 22 is inserted inside the cylindrical container 12 and if desired, can be affixed to the inner wall of the cylindrical container 12 by an adhesive or other means.

Next, the flexible printed circuit board 18 is coiled to the form 20 and inserted into the cylindrical container 12 and is electrically coupled to the multi-terminal connector 52 by the wire conductors 48.

At the same time or previously, the flexible printed circuit board 18 is electrically coupled to the resolver 14 by the wire conductors 54. Also at the same time or previously, the voltage regulator 58 is electrically coupled to the flexible printed circuit board 18. Then, after the folded printed circuit board 18 and regulator 58 are inserted into the container 12, the voltage regulator 58 is secured to the bottom wall 46 by a fastener such as a screw.

The form 24 is now inserted inside the coiled/folded flexible printed circuit board 18 and the potting compound 26 is placed between the form 24 and the insulator 22 over the flexible printed circuit board 18.

Finally, the resolver 14 is placed in the cylindrical space 56 with the wire conductors 54 in the space 57 and the shoulder 64 of the flange 60 press fitted into the container 12.

From the foregoing description, it will be apparent that the method for fabricating a resolver/encoder assembly 10 described above and the assembly 10 formed thereby has a number of advantages, some of which have been described above and others of which are inherent in the invention. Specifically, the method of the present invention allows a manufacturer to simply, quickly and inexpensively fabricate a compact resolver/encoder assembly with a stator and rotor assembly and an electronic circuit 16 encased in a container 12 with the circuit 16 insulated from moisture and impervious thereto.

Also, it will be apparent from the foregoing description that modifications can be made to the method of fabricating a resolver/encoder assembly 10 and the assembly 10 formed thereby without departing from the teachings of the present invention. For example, the electronic components of the resolver/encoder assembly can be incorporated into one or more integrated circuit chips mounted onto a flexible circuit board which is then inserted in the container 12 and insulated from adjacent metal surfaces. Accordingly, the scope of the invention is only to be limited as necessitated by the accompanying claims.

I claim:

1. A compact digital resolver/encoder assembly comprising: a resolver; a flexible printed circuit board; a number of electronic components for decoding the resolver being mounted on said flexible printed circuit board; a generally cylindrical container having a cylindrical wall, a closed end and an open end; said circuit board being folded into a generally cylindrical shape and being received in said container separate from said resolver; means for insulating said circuit board from said container including an electrical insulating potting compound situated in said container and surrounding said circuit board; and said resolver being received in said container and being spaced a predetermined distance from the encapsulated circuit board.

2. The resolver/encoder assembly of claim 1 wherein said insulating means further comprises a form in the central space of said cylindrical container with said potting compound being situated between said form and said cylindrical wall of said container.

3. The resolver/encoder assembly of claim 1 including a multi-terminal connector fixed to the bottom of said container, said connector being electrically coupled to said printed circuit board.

4. The resolver/encoder assembly of claim 1 wherein said resolver is electrically coupled to said printed circuit board.

5. The resolver/encoder assembly of claim 4 wherein said resolver is electrically coupled to said printed circuit board by insulated wire conductors which are longer than necessary for the coupling but long enough for allowing said resolver to be positioned outwardly of said container when said potting compound is inserted in said container and said central space is defined by an eccentric envelope, the eccentric portion providing space for said wire conductors, and said wire conductors are folded into loops and inserted into said eccentric space.

6. The resolver/encoder assembly of claim 5 wherein said eccentric space is formed by inserting a form having a generally tear drop cross-section in said container before said potting compound is inserted into said container and said annular space is defined between said form and the cylindrical wall of said container.

7. The resolver/encoder assembly of claim 6 wherein said form is made of an electrical insulating material.

8. The resolver/encoder assembly of claim 1 wherein said resolver/encoder includes a voltage regulator which is fixed on and to the inside of said container so that said container can serve as a heat sink for said voltage regulator.

9. The resolver/encoder assembly of claim 8 wherein said voltage regulator is fixed to the inside bottom wall of said container and said printed circuit board is positioned above said voltage regulator and physically isolated from same.

10. The resolver/encoder assembly of claim 1 wherein said circuit components are chosen, connected and operated in a manner which minimizes the heat generation therein.

11. The resolver/encoder assembly of claim 1 wherein said insulating means comprise a piece of insulating material is positioned within said container adjacent the inner surface of the cylindrical wall thereof before said potting compound is inserted in said container to ensure that there is no short circuit between said circuit board and said container.

12. The resolver/encoder assembly of claim 1 wherein said potting compound is R.T.V.

13. The resolver/encoder assembly of claim 1 wherein said potting compound is an epoxy.

14. The resolver/encoder assembly of claim 1 wherein substantially all the electronic components of the resolver/encoder are embedded in the potting compound so as to be substantially completely insulated from, and impervious to, moisture.

15. A compact digital resolver/encoder assembly comprising a resolver, electronic circuitry for decoding the resolver being formed in at least one integrated circuit chip mounted on a flexible circuit board; a container having a closed end and an open end; said integrated circuit chip and circuit board being received in said container adjacent a wall of said container; said resolver being mounted in said container separate and spaced from said circuit board; and means for insulating said integrated circuit chip from said resolver and from said container.

16. The resolver/encoder assembly of claim 1 wherein said circuit board is positioned adjacent a cylindrical wall of said container, said potting compound is located in a generally annular space in said container surrounding said circuit board in a manner so as to form a central space within the middle of said container; and said resolver is mounted in said central space in said container.

17. A compact digital resolver/encoder comprising: a resolver; a flexible circuit board; a number of electronic components for decoding the resolver being mounted on said flexible printed circuit board; a generally cylindrical container having a cylindrical wall, a closed end and an open end; said circuit board being folded into a generally cylindrical shape and being received in said container; said resolver being received in said container separate from said circuit board and being spaced a predetermined distance from said printed circuit board; means for insulating said printed circuit board from said container; and an electrical connection including flexible insulated wire conductors between said resolver and said printed circuit board.

18. The resolver/encoder of claim 17 wherein said circuit board is positioned adjacent a cylindrical wall of said container, and said means for insulating said circuit board includes a potting compound which is disposed in a generally annular formation adjacent said cylindral wall and which surrounds said circuit board.

19. The resolver/encoder of claim 18 wherein said folded circuit board defines a central space, which is larger in cross-section than the cross-section of said resolver, said resolver is received in said central space and said electrical connection is defined by insulated wire conductors which are connected between said printed circuit board and said resolver and which are longer than necessary for the connection but long enough for allowing said resolver to be positioned outwardly of said container when said potting compound is inserted in said container, said wire conductors afterwards being folded into loops and inserted into said central space.

20. A compact digital resolver/encoder assembly comprising: a resolver; a flexible printed circuit board; a generally cylindrical container having a cylindrical wall, a closed end and open end; said circuit board being folded into a generally cylindrical shape and being received in said container; said resolver being received in said container separate from said circuit board and being spaced a predetermined distance apart from said printed circuit board; and a voltage regulator which is fixed to said container inside said container so that said container can serve as a heat sink for said voltage regulator.

21. The resolver/encoder assembly of claim 20 wherein said voltage regulator is mounted on the inside bottom wall of said container.

22. The resolver/encoder assembly of claim 20 wherein said circuit board is encapsulated in a potting compound which also covers said voltage regulator and insulates said voltage regulator from said circuit board.

23. A compact digital resolver/encoder comprising: a resolver, a flexible printed circuit board; a number of electronic components for decoding the resolver being mounted on said flexible printed circuit board; a generally cylindrical container having a cylindrical wall, a closed end and an open end; said circuit board being folded into a generally cylindrical shape, being received in said container, and defining a central space; means for insulating said circuit board from said container; said resolver being mounted in said container within said central space and spaced a predetermined distance from said circuit board; and an electrical connection between said printed circuit board and said resolver, said electrical connection including insulated wire conductors which are longer than necessary for the connection but long enough for allowing said resolver to be positioned outwardly of said container when said circuit board is inserted in said container, after which said wire conductors are folded into loops and inserted into said central space with said resolver.

24. A compact digital resolver/encoder comprising: a resolver, a container having a cylindrical wall, a closed end and an open end; electronic circuitry for decoding the resolver formed in at least one integrated circuit chip mounted on a flexible printed circuit board, which is received in said container separate from said resolver; said resolver being received in said container and spaced a predetermined distance from the integrated circuit chip; means for insulating said integrated circuit chip from said container and said resolver; and a voltage regulator which is fixed on and to the inside of said container so that said container can serve as a heat sink for said voltage regulator.

* * * * *